(12) United States Patent
Moix Olivé

(10) Patent No.: US 12,306,267 B2
(45) Date of Patent: May 20, 2025

(54) SHORT-CIRCUIT ISOLATOR

(71) Applicant: Carrier Fire & Security EMEA BV, Diegem (BE)

(72) Inventor: Pere Moix Olivé, Barcelona (ES)

(73) Assignee: KIDDE FIRE PROTECTION, LLC, Bradenton, FL (US)

( * ) Notice: Subject to any disclaimer, the term of this patent is extended or adjusted under 35 U.S.C. 154(b) by 417 days.

(21) Appl. No.: 17/837,663

(22) Filed: Jun. 10, 2022

(65) Prior Publication Data

US 2022/0404433 A1 Dec. 22, 2022

(30) Foreign Application Priority Data

Jun. 18, 2021 (EP) ..................................... 21382536

(51) Int. Cl.
*G01R 31/52* (2020.01)
*G08B 25/04* (2006.01)

(52) U.S. Cl.
CPC .............. *G01R 31/52* (2020.01); *G08B 25/04* (2013.01)

(58) Field of Classification Search
USPC .......................................................... 324/509
See application file for complete search history.

(56) References Cited

U.S. PATENT DOCUMENTS

| | | | |
|---|---|---|---|
| 4,528,610 A | 7/1985 | Payne | |
| 4,568,919 A | 2/1986 | Muggli et al. | |
| 5,086,293 A | 2/1992 | Takahashi et al. | |
| 5,097,259 A | 3/1992 | Testa et al. | |
| 5,103,365 A | 4/1992 | Uchida et al. | |
| 5,117,219 A | 5/1992 | Tice et al. | |
| RE34,643 E | 6/1994 | Payne | |
| 5,400,203 A | 3/1995 | Tice | |
| 5,631,795 A | 5/1997 | Koyama | |
| 5,767,781 A | 6/1998 | Yavelberg | |
| 5,801,913 A | 9/1998 | Pittel | |
| 6,121,693 A | 9/2000 | Rock | |
| 8,675,324 B2 | 3/2014 | Noguchi | |
| 8,804,291 B2 | 8/2014 | Becker et al. | |
| 9,153,968 B2 | 10/2015 | Meah et al. | |
| 9,188,645 B2 | 11/2015 | Barrenscheen et al. | |
| 9,197,339 B2 | 11/2015 | Jonkman | |

(Continued)

FOREIGN PATENT DOCUMENTS

| | | | |
|---|---|---|---|
| EP | 0101172 B1 | 3/1987 | |
| EP | 2791925 B1 | 8/2018 | |

(Continued)

OTHER PUBLICATIONS

Euopean Search Report for Application No. 21382536.7; Issued Nov. 29, 2021; 7 Pages.

*Primary Examiner* — Farhana A Hoque
(74) *Attorney, Agent, or Firm* — CANTOR COLBURN LLP

(57) ABSTRACT

A short-circuit isolator includes a switch configured to selectively interrupt an electrical circuit connected to the short-circuit isolator. The short-circuit isolator is configured to cause the switch to interrupt the electrical circuit when a current at the short-circuit isolator exceeds a current threshold and at least one of a voltage at the short-circuit isolator is below a voltage threshold or a resistance of the electrical circuit measured at the short-circuit isolator is below a resistance threshold.

12 Claims, 4 Drawing Sheets

(56) References Cited

U.S. PATENT DOCUMENTS

| | | |
|---|---|---|
| 9,691,267 B2 | 6/2017 | Kim et al. |
| 9,767,664 B2 | 9/2017 | Kim et al. |
| 2007/0109705 A1 | 5/2007 | Gruber et al. |
| 2021/0119442 A1* | 4/2021 | Pettersson ........... H02M 1/0095 |

FOREIGN PATENT DOCUMENTS

| | | |
|---|---|---|
| GB | 2078414 A | 1/1982 |
| JP | 2020119347 A | 8/2020 |
| KR | 101867562 B1 | 7/2018 |

\* cited by examiner

SHORT-CIRCUIT ISOLATOR

FOREIGN PRIORITY

This application claims priority to European Patent Application No. 21382536.7, filed Jun. 18, 2021, and all the benefits accruing therefrom under 35 U.S.C. § 119, the contents of which in its entirety are herein incorporated by reference.

TECHNICAL FIELD OF INVENTION

The present disclosure relates to a short-circuit isolator and in particular a short-circuit isolator for fire protection systems.

BACKGROUND OF THE INVENTION

Fire protection systems typically comprise a large number of electrical components, including fire detectors (such as smoke and heat sensors), manual call points, fire alarms, and fire suppression systems (such as sprinklers, fire barriers, smoke extractors, etc.). These are typically electrically connected in a loop configuration, with the connecting wiring starting and finishing at a fire control panel. In some instances, multiple loops may be connected to a single fire control panel, and a loop may sometimes comprise one or more short spurs.

A loop configuration typically comprises a plurality of short-circuit isolators, which divide the loop into multiple, electrically isolatable segments. If a short circuit occurs, for example due to an electrical fault, then the short-circuit isolator on either side of the short circuit will activate and electrically isolate the segment containing the short circuit. The segments on either side of the isolated segment will continue to receive power because the wiring is configured as a loop, thereby preventing a single electrical fault disabling a large number of the components in the fire protection system.

Typical short-circuit isolators are prone to falsely detecting various electrical conditions of the loop, such as in rush currents and the effects of cable degradation, as short circuits and hence can isolate segments of the loop in error. The unnecessary isolation of segments of the loop represents a safety risk, as the fire protection components in that segment are deactivated, and may require manual intervention to reactivate the isolated segment.

A need therefore exists for improved short-circuit isolators.

SUMMARY OF THE INVENTION

According to a first aspect, the present invention provides a short-circuit isolator comprising: a switch configured to selectively interrupt an electrical circuit connected to the short-circuit isolator, wherein the short-circuit isolator is configured to cause the switch to interrupt the electrical circuit when a current at the short-circuit isolator exceeds a current threshold and at least one of a voltage at the short-circuit isolator is below a voltage threshold or a resistance of the electrical circuit measured at the short-circuit isolator is below a resistance threshold.

The short-circuit isolator interrupting the electrical circuit based on current at the short-circuit isolator and at least one of a voltage at the short-circuit isolator or a resistance of the electrical circuit measured at the short-circuit isolator allows the short-circuit isolator to more accurately detect short circuits. That is, the short-circuit isolator may be less susceptible to conditions of the electrical circuit that may cause typical short-circuit isolators to falsely detect a short circuit such as in rush current, line degradation and the like.

The short-circuit isolator may comprise a current measurement circuit configured to measure the current at the short-circuit isolator. The current measurement circuit may be configured to generate a voltage corresponding to the current at the short circuit isolator. The current measurement circuit may comprise a shunt resistor and an amplifier. The amplifier may be connected across the shunt resistor. That is to say, a voltage output by the amplifier may be proportional to a voltage drop across the shunt resistor. The amplifier may be configured to generate the voltage corresponding to the current at the short circuit isolator.

The short-circuit isolator may comprise a voltage measurement circuit configured to measure the voltage at the short-circuit isolator. The voltage measurement circuit may comprise at least one resistance connected between a live wire and ground. The voltage measurement circuit may comprise a voltage divider configured to generate a voltage proportional to the voltage at the short circuit isolator.

The short circuit isolator may comprise a reference voltage generating circuit configured to generate a first reference voltage corresponding to the current threshold. The reference voltage generating circuit may be configured to generate a second reference voltage corresponding to the voltage threshold. The first reference voltage may be a predetermined voltage and/or the second reference voltage may be a predetermined voltage. The first reference voltage and the second reference voltage may be different voltages.

The short-circuit isolator may comprise a first comparator circuit and may further comprise a second comparator circuit, wherein the first comparator circuit may be configured to detect if the current at the short-circuit isolator is greater than the current threshold.

The second comparator circuit may be configured to detect if the voltage at the short-circuit isolator is less than the voltage threshold.

The short-circuit isolator may be configured to cause the switch to interrupt an electrical circuit connected to the short-circuit isolator when the first comparator circuit detects that the current at the short-circuit isolator is greater than the current threshold and the second comparator circuit detects that the voltage at the short-circuit isolator is less than the voltage threshold.

The short circuit isolator may be configured not to cause the switch to interrupt an electrical circuit connected to the short circuit isolator if neither or only one of the first comparator circuit detects that the current at the short circuit isolator is greater than the current threshold and the second comparator circuit detects that the voltage at the short circuit isolator is less than the voltage threshold.

The short-circuit isolator may further comprise a latch configured to cause the switch to interrupt an electrical circuit connected to the short-circuit isolator when the first comparator circuit detects that the current at the short-circuit isolator is greater than the current threshold and the second comparator circuit detects that the voltage at the short-circuit isolator is less than the voltage threshold.

The latch may be configured not to cause the switch to interrupt an electrical circuit connected to the short circuit isolator if neither or only one of the first comparator circuit detects that the current at the short circuit isolator is greater than the current threshold and the second comparator circuit detects that the voltage at the short circuit isolator is less than the voltage threshold.

The second comparator circuit may be configured to detect if the resistance measured at the short-circuit isolator is less than the resistance threshold.

The second comparator circuit may be configured to perform a weighted comparison between the current at the short-circuit isolator and the voltage at the short-circuit isolator to detect if the resistance measured at the short-circuit isolator is less than the resistance threshold. Weightings of the weighted comparison may be such that the weighted current and the weight voltage are equal when the resistance at the short circuit isolator is equal to the resistance threshold.

The second comparator circuit may be configured to compare the voltage generated by the voltage measurement circuit to the voltage generated by the current measurement circuit. The second comparator may be configured to detect if the resistance of the electrical circuit at the short circuit isolator is below the resistance threshold if the voltage generated by the current measurement circuit is greater than the voltage generated by the voltage measurement circuit. That is to say, the weightings of the weighted comparison may be set by the configurations of the voltage measurement circuit and the current measurement circuit. Optionally, additional components may be used to set the weightings, such as one or more voltage divider or the like.

The short-circuit isolator may be configured to cause the switch to interrupt an electrical circuit connected to the short-circuit isolator when the first comparator circuit detects that the current at the short-circuit isolator is greater than the current threshold and the second comparator circuit detects that the resistance measured at the short-circuit isolator is less than the resistance threshold.

The short circuit isolator may be configured not to cause the switch to interrupt an electrical circuit connected to the short circuit isolator if neither or only one of the first comparator circuit detects that the current at the short circuit isolator is greater than the current threshold and the second comparator circuit detects that the resistance at the short circuit isolator is less than the resistance threshold.

The short-circuit isolator may further comprise a latch configured to cause the switch to interrupt an electrical circuit connected to the short-circuit isolator when the first comparator circuit detects that the current at the short-circuit isolator is greater than the current threshold and the second comparator circuit detects that the resistance at the short-circuit isolator is less than the resistance threshold.

The latch may be configured not to cause the switch to interrupt an electrical circuit connected to the short circuit isolator if neither or only one of the first comparator circuit detects that the current at the short circuit isolator is greater than the current threshold and the second comparator circuit detects that the resistance at the short circuit isolator is less than the resistance threshold.

The latch may be configured to retain the switch in an interrupting state until reset. The latch may be configured to automatically reset, such as after a predetermined condition is met, or may be configured to be manually reset. In one embodiment, there is provided a fire protection system comprising: a fire control panel; and a plurality of components electrically connected to the fire control panel in a circuit having a loop configuration; wherein the circuit is divided into a plurality electrically-isolatable segments using a plurality of short-circuit isolators as described above.

In another embodiment, there is provided a fire protection system comprising: two fire control panels; and a plurality of components electrically connected to each of the two fire control panels in a circuit having a bi-directional configuration; wherein the circuit is divided into a plurality electrically-isolatable segments using a plurality of short-circuit isolators as described above.

The plurality of components may comprise one or more of a fire detector, an alarm, a manual call point and a sounder.

One or more of the plurality of short-circuit isolators may be embedded within one or more of the plurality of components.

Viewed from a second aspect, the present invention provides a method of isolating a short circuit within an electrical circuit comprising: measuring a current and a voltage in the electrical circuit at a short-circuit isolator; and interrupting the electrical circuit using the short-circuit isolator in response to determining that the measured current exceeds a current threshold and at least one of the measured voltage is below a voltage threshold or a resistance corresponding to the measure current and the measured voltage is below a resistance threshold.

The short-circuit isolator used in this method may be as described above, optionally including any one or more or all of the optional features described.

BRIEF DESCRIPTION OF THE DRAWINGS

Certain preferred embodiments of the present disclosure will now be described in greater detail, by way of example only and with reference to the following figures, in which.

DETAILED DESCRIPTION OF THE INVENTION

Figure 1:
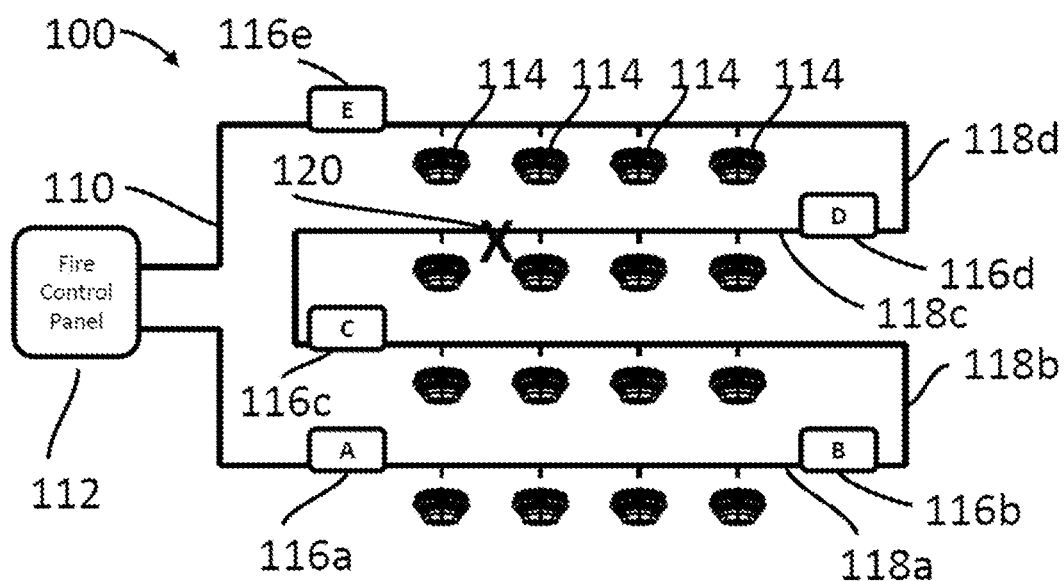
FIG. 1 shows a schematic diagram of part of a fire protection system comprising a plurality of fire detectors and a plurality of short-circuit isolators.

FIG. 1 is a schematic diagram illustrating power-transmission wiring 110 within a first fire protection system 100.

The fire protection system 100 comprises a fire control panel 112 and a plurality of fire detectors 114, which in this example are illustrated as smoke sensors. The fire detectors 114 are electrically connected to the fire control panel 112 in a loop configuration, with the wiring 110 of the loop starting and finishing at the fire control panel 112.

The wiring 110 comprises a plurality of short-circuit isolators 116a-116e, which divide the wiring into a plurality of electrically-isolatable segments 118a-118d. In the event that a short circuit 120 occurs, for example due to an electrical fault, then the short-circuit isolators 116c, 116d on either side of the short circuit 120 will activate and electrically isolate the segment 118c containing the short circuit 120.

In one example, if a short circuit 120 were to occur at an exemplary location X, then short-circuit isolators C 116c and D 116d would isolate the segment 118c containing location X. The segments 118b, 118d on either side of the short circuit 120 (between isolators B 116b and C 116c, and between isolators D 116d and E 116e) will continue to receive power because the wiring 110 is configured as a loop, thereby preventing a single electrical fault from disabling the entire loop. For this reason, the number of electrical components permitted in a single electrically-isolatable segment 118 is normally restricted, for example to below 32 components.

Whilst the wiring 110 is shown in the illustrations as a single line, it will be appreciated that electrical wiring 110 typically comprises at least two conductors, acting as a neutral conductor and a live conductor, respectively. Optionally, an earth or ground conductor may be included.

In addition to powering the fire detectors 114, the fire control panel 112 can send and receive data through the wiring 110. The fire control panel 112 sends data via voltage pulses, for instance commands to a fire detector 114, and receives data via current pulses, for instance a response from a fire detector 114.

Figure 2:
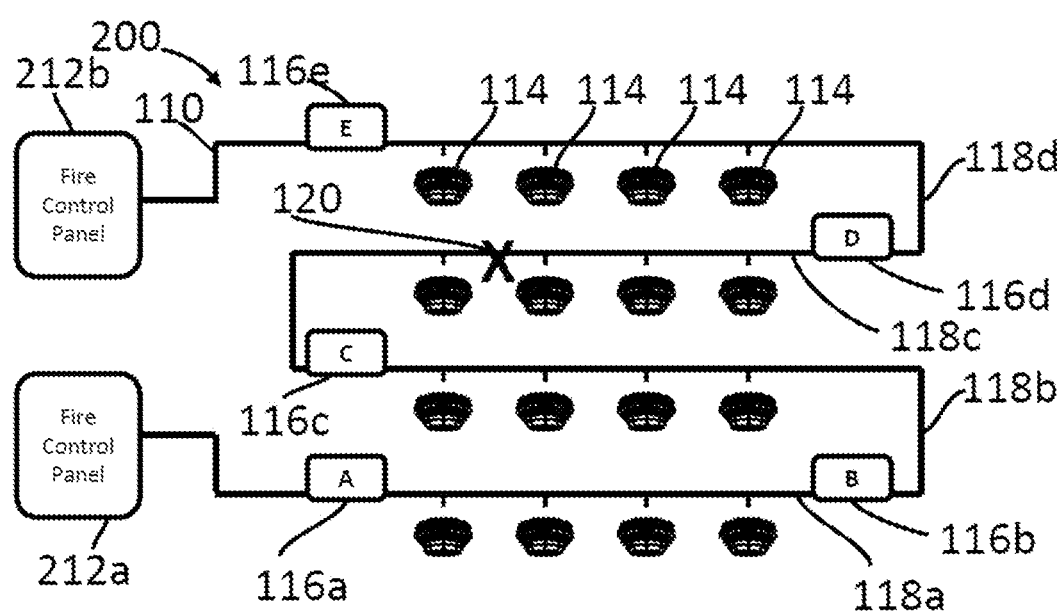
FIG. 2 shows another schematic diagram of part of a fire protection system comprising a plurality of fire detectors and a plurality of short-circuit isolators

FIG. 2 is a schematic diagram illustrating power-transmission wiring 110 within a second fire protection system 200.

The second fire protection system 200 comprises components similar to those described in relation to the first fire protection system 100 except that it comprises a first fire control panel 212a and a second fire control panel 212b with the electrical wiring 110 starting at the first fire control panel 212a and finishing at the second fire control panel 212b. Like components are indicated using like reference numbers, incremented by 100, and these components will not be discussed again.

The first fire control panel 212a and the second fire control panel 212b are configured to operate in a redundant manner, such that in the event of failure of one fire control panel 212, the other fire control panel 212 can still operate the entire fire protection system 200.

If a short circuit 120 were to occur at an exemplary location X, then short-circuit isolators C 116c and D 116d would isolate the segment 118c containing location X as previously described in relation to FIG. 1. However, with this arrangement, the segment 118b on one side of the short circuit 120 (between isolators B 16b and C 16c) will continue to receive power from the first fire control panel 212a, whilst the segment 118d on the other side of the short circuit 120 (between isolators D 116d and E 116e) will receive power from the second fire control panel 212b.

Figure 3:
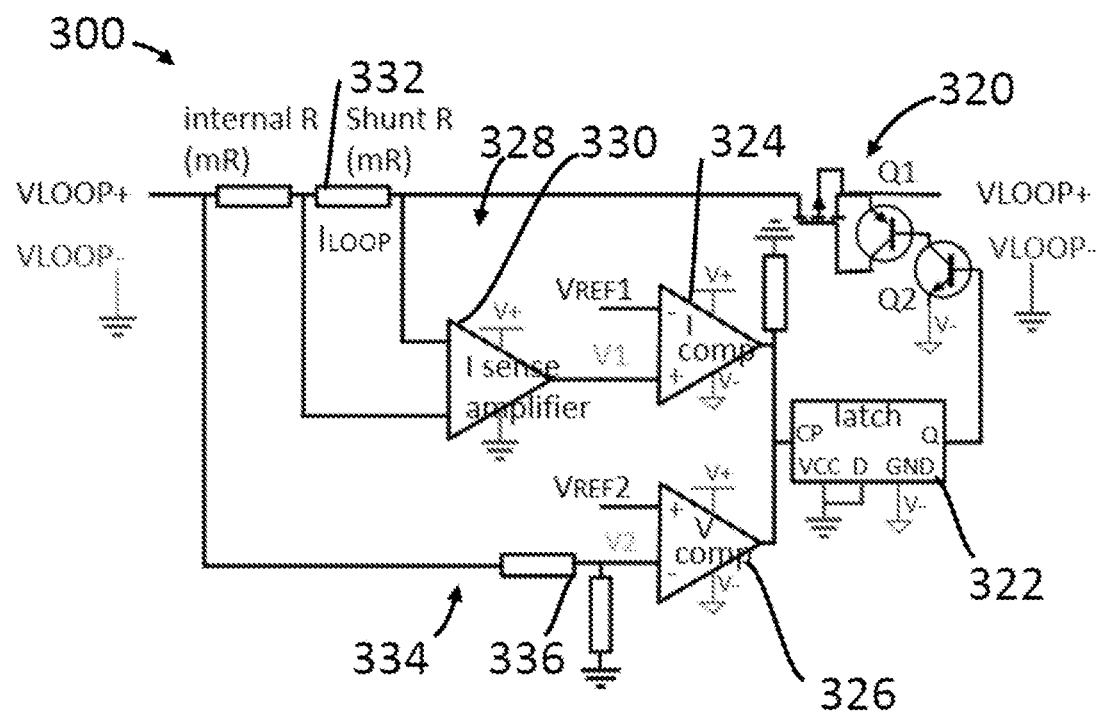
FIG. 3 shows a schematic diagram of a control circuit for a short-circuit isolator.

FIG. 3 shows a schematic diagram of a first control circuit 300 for a short-circuit isolator, such as short-circuit isolators 116a-116e shown in FIGS. 1 and 2. The first control circuit 300 is configured to isolate a segment 118a-118d of the wiring 110 of a fire protection system 100; 200 based on a measured current and a measured voltage of the wiring 110.

The control circuit 300 comprises a switch 320, a latch 322, a first (current) comparator circuit 324 and a second (voltage) comparator circuit 326. The switch 320 is connected to a live conductor, VLOOP+, of the wiring 110 of the fire protection system 100; 200 such that it can interrupt the live conductor, VLOOP+, of the wiring 110 when opened. The switch 320 being connected to the live conductor, VLOOP+, of the wiring 110 provides a means of preventing power transmission to a subsequent segment 118a-118d of the wiring 110 when a short circuit is detected. A neutral conductor, VLOOP−, of the wiring 110 of the fire protection system 100; 200 is passed through the control circuit 300. The input of the latch 322 is connected to both the first comparator circuit 324 and the second comparator circuit 326, the output of the latch 322 is connected to the switch 320 such that a signal output of the latch can cause the switch to open or close.

The control circuit 300 further comprises a current measurement circuit 328 comprising an amplifier 330 connected across a shunt resistor 332, the output of the amplifier 330 is connected to the first comparator circuit 324.

The shunt resistor 332 is connected to the input of the control circuit 300 at one end and the switch 320 at the other end such that when the switch 320 is closed the current passing through the shunt resistor 332 is the current, Iloop, in the wiring 110 in the fire protection system 100; 200. The shunt resistor 332 is typically connected to the live wire of the wiring 110, but can alternatively be connected to the neutral wire of the wiring 110.

The shunt resistor 332 has a fixed, predetermined resistance and the amplifier 330 has a fixed, predetermined gain. Therefore, the voltage, V1, output by the amplifier 330, i.e. the amplified voltage drop across the shunt resistor, is proportional to the current at the control circuit 300. Since the resistance of the shunt resistor 332 and the gain of the amplifier 330 are known, this voltage, V1, can be used to determine the current, Iloop, in the wiring 110. A current threshold is provided by generating a first reference voltage, VREF1, at a predetermined value representing the current threshold and corresponding to the voltage, V1, output by the amplifier 330 when the current, Iloop, in the wiring 110 is at the current threshold. The reference voltage, VREF1, is provided to the first comparator circuit 324 by a current threshold generating circuit, not shown, or any other means of generating a predetermined voltage known in the art.

The first comparator circuit 324 compares the current, Iloop, at the control circuit 300 to the predetermined current threshold and outputs a signal to the latch 322 indicative of whether the measured current exceeds the current threshold or not. That is, the first comparator circuit 324 is configured to compare the voltage, V1, outputted by the amplifier 330 representing the current, Iloop, at the short-circuit isolator 300 to the first reference voltage, VREF1, representing the current threshold. The first comparator circuit 324 in the illustrated example will output a high value if the measured current, Iloop, exceeds the current threshold.

The control circuit 300 further comprises a voltage measurement circuit 334 comprising a voltage divider 336 connected between ground and the input of the control circuit 300. The voltage divider 336 provides a voltage, V2, proportional to the voltage, VLOOP, in the wiring 110 at the control circuit 300, to the second comparator circuit 326. The voltage threshold is provided by generating a second reference voltage, VREF2, at a predetermined value representing the voltage threshold and corresponding to the voltage, V2, output by the voltage divider 336 when the voltage, VLOOP, in the wiring 110 is at the voltage threshold. The second reference voltage, VREF2, is provided to the second comparator circuit 326 by a voltage threshold generating circuit, not shown, or any other means of setting a predetermined voltage known in the art.

The second comparator circuit 326 compares the voltage, VLOOP, at the control circuit 300 to the predetermined voltage threshold and outputs a signal to the latch 322 indicative of whether the voltage is below the voltage threshold or not. That is, the second comparator circuit 326 is configured to compare the voltage, V1, outputted by the voltage divider 336 representing the voltage at the control circuit 300 to the second reference voltage, VREF2, representing the voltage threshold. The second comparator circuit 326 in the illustrated example will output a high value if the measured voltage, VLOOP−, drops below the voltage threshold for instance.

The latch 322 causes the switch 320 to open, thereby interrupting the wiring 110 of the fire protection system 100; 200 at the position of the short-circuit isolator 116a-116e when the output of both the first comparator circuit 324 and the second comparator circuit 326 indicates that both the current, I1, exceeds the current threshold and the voltage, VLOOP, is below the voltage threshold.

In the illustrated example, the latch 322 causes the switch 320 to open when a high value is received from both the first and second comparator circuits 324, 326. Though an example is shown in which the comparator circuits, 324, 326 output high values to indicate the relevant threshold has been breached, the skilled person would understand other forms of logic processing may be used to achieve a similar effect, by use of appropriate NOT, AND, NOR gates and the like.

Since the control circuit 300 opens the switch 320 based on both the current and voltage of the wiring 110 at the short-circuit isolator 116a-116e, the control circuit 300 is less prone to interrupting the wiring 110 due to conditions other than short circuits. For instance, if the control circuit 300 were configured to isolate based on current alone, then an in-rush current when one or more of the fire detectors 114 sends data to the fire control panel 112; 212a, 212b via a current pulse may falsely indicate a short circuit. Alternatively, if the control circuit 300 were configured to isolate based on voltage alone, then voltage variation such as when the fire control panel 112; 212a, 212b transmits data via voltage pulses to the fire detectors 114 may falsely indicate a short circuit.

Further, given that the control circuit 300 is less prone to falsely isolating the circuit due to conditions affecting the current and voltage of the wiring 110 then the current and voltage thresholds can be set closer to the normal operational values. That is, where the threshold in a typical control circuit that isolates only on the basis of voltage or current may need to set a relatively wide threshold to avoid false isolations, the thresholds of the present control circuit 300 may be relatively narrow. This advantageously allows faster detection and higher accuracy in detecting short circuits.

Figure 4:
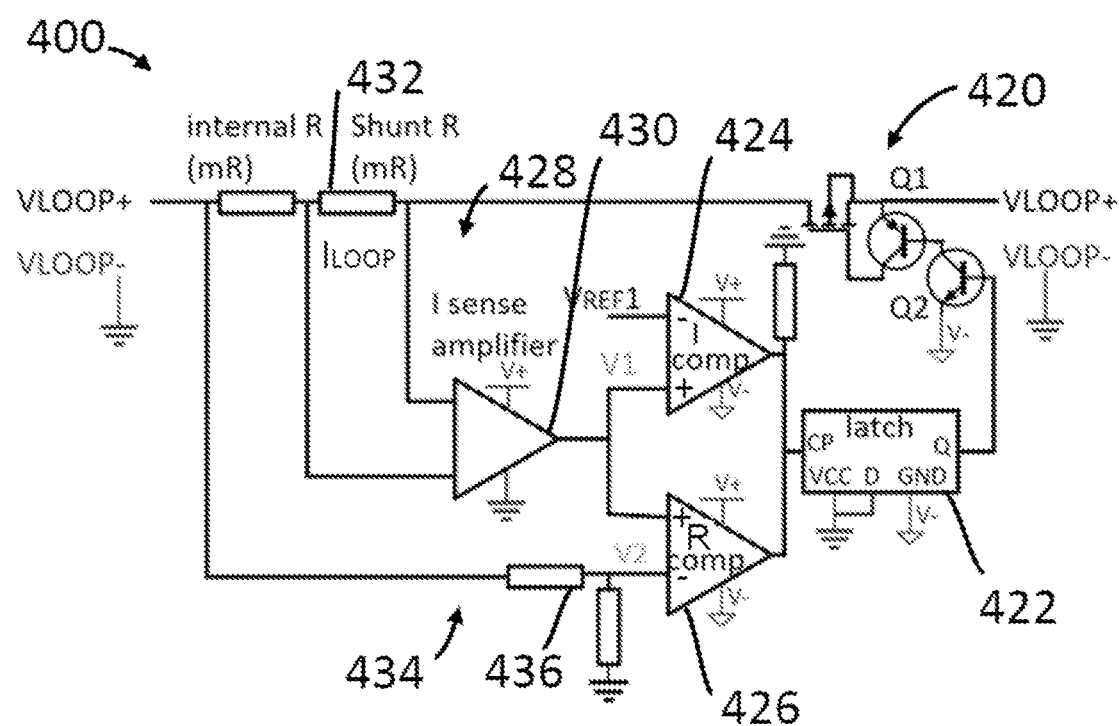
FIG. 4 shows another schematic diagram of a control circuit for a short-circuit isolator.

FIG. 4 shows a schematic diagram of a second control circuit 400 for a short-circuit isolator, such as short-circuit isolators 116a-116e shown in FIGS. 1 and 2. The second control circuit 400 is configured to isolate a segment 118a-118d of the wiring 110 of a fire protection system 100; 200 based on a measured current and a measured resistance of the wiring 110.

The second control circuit 400 comprises elements similar to those previously described for the first control circuit 300 with the exception that the second comparator circuit 426 is configured to measure resistance and hence there is the following differences. Like components are indicated using like reference numbers, incremented by 100, and these components will not be discussed again.

In this embodiment, the second comparator circuit 426 compares the voltage, V1, output by the amplifier 430 to the voltage, V2, output by the voltage divider 436. The comparison of the voltage against the current in the wiring 110 at the control circuit 400 in a predetermined ratio is equivalent to comparing the resistance of the wiring 110 to a resistance threshold, where the resistance threshold is set by the gain of amplification of the amplifier 430 and the resistance ratio of the voltage of the voltage divider 436. That is, the resistance threshold is the resistance of the wiring 110 when the voltage, V1, output by the amplifier 430 and the voltage, V2, output by the voltage divider 436 are equal.

Therefore, the second comparator circuit 426 in this embodiment compares the resistance of the electrical circuit at the control circuit 400 to the predetermined resistance threshold and outputs a signal to the latch 422 indicative of whether the resistance is below the resistance threshold or not. For example, the second comparator circuit 426 may output a high value if the measured resistance drops below the resistance threshold for instance.

Since the control circuit 400 opens the switch 420 based on both the current and resistance of the wiring 110 at the short-circuit isolator 116a-116e, the control circuit 400 is less prone to interrupting the wiring 110 due to conditions other than short circuits. For instance, if the control circuit 400 were configured to isolate based on current alone, then an in-rush current when one or more of the fire detectors 114 sends data to the fire control panel 112; 212a, 212a via a current pulse may falsely indicate a short circuit. Alternatively, if the control circuit 400 were configured to isolate based on resistance alone, the resistance threshold would need to be set at a value with sufficient margin from the normal wiring 110 resistance to account for potential variations due to conditions such as cable degradation and temperature.

Further, given that the control circuit 400 is less prone to falsely isolating the circuit due to conditions affecting the current and resistance of the wiring 110 then the current and resistance thresholds can be set closer to the normal operation values. That is, where the threshold in a typical control circuit that isolates only on the basis of voltage or resistance may need to set a relatively wide threshold to avoid false isolations, the thresholds of the present control circuit 400 may be relatively narrow. This advantageously allows faster detection and higher accuracy in detecting short circuits.

Whilst a short circuit isolator 116 may comprise only one the control circuits 300, 400, as illustrated, it may optionally comprise two such control circuits 300, 400. For instance, a first side of a short-circuit isolator 116 may comprise one control circuit 300; 400 and a second side of the short-circuit isolator may comprise another control circuit 300; 400 that is connected in a mirror image configuration.

It will be appreciated that whilst the control circuit 300; 400 has been described in connection with fire protection systems 100; 200, the control circuit 300; 400 may be applied to other systems that require the isolation of segments of an electrical circuit.

What is claimed is:

1. A short-circuit isolator comprising:
a switch configured to selectively interrupt an electrical circuit connected to the short-circuit isolator,
wherein the short-circuit isolator is configured to cause the switch to interrupt the electrical circuit when a current at the short-circuit isolator exceeds a current threshold and a voltage at the short-circuit isolator is below a voltage threshold;
a first comparator circuit and a second comparator circuit, wherein the first comparator circuit is configured to detect if the current at the short-circuit isolator is greater than the current threshold;
wherein the second comparator circuit is configured to detect if the voltage at the short-circuit isolator is less than the voltage threshold;
wherein the short-circuit isolator is configured to cause the switch to interrupt an electrical circuit connected to the short-circuit isolator when the first comparator circuit detects that the current at the short-circuit isolator is greater than the current threshold and the second comparator circuit detects that the voltage at the short-circuit isolator is less than the voltage threshold.

2. The short-circuit isolator of claim 1, further comprising a latch configured to cause the switch to interrupt an electrical circuit connected to the short-circuit isolator when the first comparator circuit detects that the current at the short-circuit isolator is greater than the current threshold and the second comparator circuit detects that the voltage at the short-circuit isolator is less than the voltage threshold.

3. The short-circuit isolator of claim 2, wherein the latch is configured to retain the switch in an interrupting state until reset.

4. A short-circuit isolator comprising:
a switch configured to selectively interrupt an electrical circuit connected to the short-circuit isolator,
wherein the short-circuit isolator is configured to cause the switch to interrupt the electrical circuit when a current at the short-circuit isolator exceeds a current threshold and a resistance of the electrical circuit measured at the short-circuit isolator is below a resistance threshold;
the short-circuit isolator further comprising a first comparator circuit and a second comparator circuit,
wherein the first comparator circuit is configured to detect if the current at the short-circuit isolator is greater than the current threshold,
wherein the second comparator circuit is configured to detect if the resistance measured at the short-circuit isolator is less than the resistance threshold, and;
wherein the short-circuit isolator is configured to cause the switch to interrupt an electrical circuit connected to the short-circuit isolator when the first comparator circuit detects that the current at the short-circuit isolator is greater than the current threshold and the second comparator circuit detects that the resistance measured at the short-circuit isolator is less than the resistance threshold.

5. The short-circuit isolator of claim 4, wherein the second comparator circuit is configured to perform a weighted comparison between the current at the short-circuit isolator and the voltage at the short-circuit isolator to detect if the resistance measured at the short-circuit isolator is less than the resistance threshold.

6. The short-circuit isolator of claim 4, further comprising a latch configured to cause the switch to interrupt an electrical circuit connected to the short-circuit isolator when the first comparator circuit detects that the current at the short-circuit isolator is greater than the current threshold and the second comparator circuit detects that the resistance at the short-circuit isolator is less than the resistance threshold.

7. A fire protection system comprising:
a fire control panel; and
a plurality of components electrically connected to the fire control panel in a circuit having a loop configuration;
wherein the circuit is divided into a plurality electrically-isolatable segments using a plurality of short-circuit isolators, each of the plurality of short-circuit isolators comprising:
a switch configured to selectively interrupt an electrical circuit connected to the short-circuit isolator,
wherein the short-circuit isolator is configured to cause the switch to interrupt the electrical circuit when a current at the short-circuit isolator exceeds a current threshold and at least one of a voltage at the short-circuit isolator is below a voltage threshold or a resistance of the electrical circuit measured at the short-circuit isolator is below a resistance threshold.

8. The fire protection system of claim 7, wherein the plurality of components comprise one or more of a fire detector, an alarm, and a manual call point.

9. The fire protection system of claim 7, wherein one or more of the plurality of short-circuit isolators are embedded within one or more of the plurality of components.

10. A method of isolating a short-circuit within the circuit of the fire protection system according to claim 7, the method comprising:
measuring a current and a voltage in the electrical circuit at one of the short-circuit isolators; and
interrupting the electrical circuit using that short-circuit isolator in response to determining that the measured current exceeds a current threshold and at least one of the measured voltage is below a voltage threshold or a resistance corresponding to the measure current and the measured voltage is below a resistance threshold.

11. A fire protection system comprising:
two fire control panels; and
a plurality of components electrically connected to each of the two fire control panels in a circuit having a bi-directional configuration;
wherein the circuit is divided into a plurality electrically-isolatable segments using a plurality of short-circuit isolators, each of the plurality of short-circuit isolators comprising:
a switch configured to selectively interrupt an electrical circuit connected to the short-circuit isolator,
wherein the short-circuit isolator is configured to cause the switch to interrupt the electrical circuit when a current at the short-circuit isolator exceeds a current threshold and at least one of a voltage at the short-circuit isolator is below a voltage threshold or a resistance of the electrical circuit measured at the short-circuit isolator is below a resistance threshold.

12. A method of isolating a short-circuit within the circuit of the fire protection system according to claim 11, comprising:
measuring a current and a voltage in the electrical circuit at one of the short-circuit isolators; and
interrupting the electrical circuit using that short-circuit isolator in response to determining that the measured current exceeds a current threshold and at least one of the measured voltage is below a voltage threshold or a resistance corresponding to the measure current and the measured voltage is below a resistance threshold.

* * * * *